United States Patent
Noh et al.

(10) Patent No.: US 11,737,313 B2
(45) Date of Patent: Aug. 22, 2023

(54) DISPLAY APPARATUS

(71) Applicant: Samsung Display Co., Ltd., Yongin-si (KR)

(72) Inventors: Hyunwoo Noh, Yongin-si (KR); Keunyoung Park, Yongin-si (KR); Haeil Park, Yongin-si (KR); Moonjung Baek, Yongin-si (KR); Kwangkeun Lee, Yongin-si (KR); Junhan Lee, Yongin-si (KR); Suji Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 307 days.

(21) Appl. No.: 17/219,519

(22) Filed: Mar. 31, 2021

(65) Prior Publication Data

US 2022/0052296 A1 Feb. 17, 2022

(30) Foreign Application Priority Data

Aug. 14, 2020 (KR) .......................... 10-2020-0102713

(51) Int. Cl.
*H10K 59/38* (2023.01)
*H10K 50/852* (2023.01)
(Continued)

(52) U.S. Cl.
CPC ......... *H10K 50/852* (2023.02); *H10K 50/818* (2023.02); *H10K 59/12* (2023.02);
(Continued)

(58) Field of Classification Search
CPC .... H10K 50/852; H10K 59/38; H10K 50/818; H10K 59/12; H10K 2102/3026; H10K 2102/331
(Continued)

(56) References Cited

U.S. PATENT DOCUMENTS 10,114,247 B2 10/2018 Lee
10,268,066 B2 4/2019 Lee et al.
(Continued)

FOREIGN PATENT DOCUMENTS

EP 3693999 A1 8/2020
KR 10-2015-0051602 A 5/2015
(Continued)

OTHER PUBLICATIONS

Extended European Search Report issued in related European Application No. 21191405.6, dated Jan. 28, 2022, 9 pages.

*Primary Examiner* — Xia L Cross
(74) *Attorney, Agent, or Firm* — Lewis Roca Rothgerber Christie LLP

(57) ABSTRACT

A display apparatus includes: a top substrate over a bottom substrate and including a first region; a second-color color filter layer on a bottom surface of the top substrate and having a 2-$1^{st}$ opening exposing the first region; a first-color color filter layer including a portion in the 2-$1^{st}$ opening and a portion on a bottom surface of the second-color color filter layer; a bank between the first-color and the second-color color filter layers and the bottom substrate, the bank having a first opening corresponding to the first region, the first opening including a 1-$1^{st}$ portion overlapping the 2-$1^{st}$ opening and a 1-$2^{nd}$ portion outside the 2-$1^{st}$ opening; a first-color quantum dot layer in the first opening; and a first reflective layer on an inner surface of the first opening and a portion of a top surface of the first-color quantum dot layer.

15 Claims, 10 Drawing Sheets

(51) Int. Cl.
*H10K 50/818* (2023.01)
*H10K 59/12* (2023.01)
*H10K 71/00* (2023.01)
*H10K 102/00* (2023.01)

(52) U.S. Cl.
CPC ............ *H10K 59/38* (2023.02); *H10K 71/00* (2023.02); *H10K 2102/3026* (2023.02); *H10K 2102/331* (2023.02)

(58) Field of Classification Search
USPC .......................................................... 257/40
See application file for complete search history.

(56) References Cited

U.S. PATENT DOCUMENTS

| 10,804,334 | B2 | 10/2020 | Song et al. |
| 2015/0318447 | A1 | 11/2015 | Choi |
| 2018/0088404 | A1* | 3/2018 | Chae ...................... H10K 59/38 |
| 2018/0210282 | A1* | 7/2018 | Song ................. G02F 1/133536 |
| 2019/0025634 | A1* | 1/2019 | Park ................. G02F 1/133516 |
| 2020/0041709 | A1 | 2/2020 | Lee et al. |
| 2020/0152704 | A1 | 5/2020 | Jang et al. |
| 2021/0351238 | A1 | 11/2021 | Park et al. |

FOREIGN PATENT DOCUMENTS

| KR | 10-2016-0086739 A | 7/2016 |
| KR | 10-2017-0014755 A | 2/2017 |
| KR | 10-2019-0130697 A | 11/2019 |
| KR | 10-2020-0014450 A | 2/2020 |
| KR | 10-2020-0054423 A | 5/2020 |
| WO | WO 2020/085606 A1 | 4/2020 |

\* cited by examiner

DISPLAY APPARATUS

CROSS-REFERENCE TO RELATED APPLICATION

This application claims priority to and the benefit of Korean Patent Application No. 10-2020-0102713, filed on Aug. 14, 2020, the entire content of which is hereby incorporated by reference.

BACKGROUND

1. Field

One or more embodiments relate to a display apparatus, and more particularly, to a display apparatus in which light efficiency is improved while white balance of reflected light is maintained.

2. Description of Related Art

A display apparatus includes a plurality of pixels. For a full-color display apparatus, a plurality of pixels may emit light of different colors. For this purpose, at least some pixels of a display apparatus have a color-converting portion. Accordingly, light having one color generated from a light-emitting portion of some pixels is converted to light having another color while passing through a corresponding color-converting portion and emitted to the outside.

SUMMARY

However, a display apparatus according to the related art has low light efficiency.

Aspects of one or more embodiments are directed towards a display apparatus in which light efficiency is improved while white balance of reflected light is maintained. However, such an aspect is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a bottom substrate, a first light-emitting element over the bottom substrate and including a second-color emission layer, a top substrate over the bottom substrate with the first light-emitting element therebetween and including a first region corresponding to the first light-emitting element, a second-color color filter layer on a bottom surface of the top substrate facing (e.g., overlapping) the bottom substrate, the second-color color filter layer having a 2-1st opening that exposes the first region, a first-color color filter layer including a portion in (e.g., filling) the 2-1st opening and a portion on a bottom surface of the second-color color filter layer facing the bottom substrate, a bank between the first-color color filter layer and the bottom substrate and between the second-color color filter layer and the bottom substrate, the bank having a first opening that corresponds to the first region, the first opening including a 1-1st portion overlapping the 2-1st opening and a $1\text{-}2^{nd}$ portion outside the 2-1st opening when viewed from a direction normal to the bottom surface of the top substrate, a first-color quantum dot layer in (e.g., filling) the first opening, and a first reflective layer on an inner surface of the first opening of the bank and on a portion of a top surface of the first-color quantum dot layer facing the top substrate, the portion of the top surface of the first-color quantum dot layer corresponding to the $1\text{-}2^{nd}$ portion.

The first reflective layer may be on a portion of the inner surface of the first opening of the bank.

When viewed from a direction normal to the top substrate, the first opening may include a portion protruding in a direction defined in a virtual plane parallel to the bottom surface of the top substrate, and the first reflective layer may correspond to the portion of the first opening that protrudes.

The first light-emitting element may include a reflective electrode.

The display apparatus may further include a first additional reflective layer on a portion of a bottom surface of the first-color quantum dot layer facing the bottom substrate, the portion of the bottom surface of the first-color quantum dot layer corresponding to the $1\text{-}2^{nd}$ portion.

The first reflective layer may be coupled (e.g., connected) to the first additional reflective layer.

The display apparatus may further include a second light-emitting element over the bottom substrate and including a second-color emission layer, wherein the second-color color filter layer may cover a second region of the top substrate that corresponds to the second light-emitting element, the first-color color filter layer may have a $1\text{-}2^{nd}$ opening that corresponds to the second region, the bank may have a second opening corresponding to the second region, and when viewed from a direction normal to the bottom surface of the top substrate, the second opening may include a $2\text{-}1^{st}$ portion overlapping the $1\text{-}2^{nd}$ opening and a $2\text{-}2^{nd}$ portion outside the $1\text{-}2^{nd}$ opening.

The second light-emitting element may include a reflective electrode.

The display apparatus may further include a third light-emitting element over the bottom substrate and including the second-color emission layer, wherein the second-color color filter layer may have a $2\text{-}3^{rd}$ opening that exposes a third region of the top substrate that corresponds to the third light-emitting element, the first-color color filter layer may have a $1\text{-}3^{rd}$ opening that corresponds to the third region, the bank may have a third opening that corresponds to the third region, when viewed from a direction normal to the bottom surface of the top substrate, the third opening may include a 3-1st portion overlapping the $2\text{-}3^{rd}$ opening and a $3\text{-}2^{nd}$ portion outside the $2\text{-}3^{rd}$ opening, and the display apparatus may further include a third-color color filter layer in (e.g., filling) the $2\text{-}3^{rd}$ opening, a third-color quantum dot layer in (e.g., filling) the third opening, and a third reflective layer on an inner surface of the third opening of the bank and on a portion of a top surface of the third-color quantum dot layer facing the top substrate, the portion of the top surface of the third-color quantum dot layer corresponding to the $3\text{-}2^{nd}$ portion.

The third reflective layer may be on a portion of the inner surface of the third opening of the bank.

When viewed from a direction normal to the top substrate, the third opening may include a portion protruding in a direction defined in a virtual plane parallel to the bottom surface of the top substrate facing the bottom substrate, and the third reflective layer may correspond to the portion that protrudes.

When viewed from a direction normal to the top substrate, the first opening may include a portion protruding in the first direction, and the first reflective layer may be on a portion of the inner surface of the first opening of the bank, and the portion of the top surface of the first-color quantum dot layer facing the top substrate that the first reflective layer is on may correspond to the portion of the first opening that protrudes.

The third light-emitting element may include a reflective electrode.

The display apparatus may further include a third additional reflective layer on a portion of a bottom surface of the third-color quantum dot layer facing the bottom substrate, the portion of the bottom surface of the third-color quantum dot layer corresponding to the 3-$2^{nd}$ portion.

The third reflective layer may be coupled (e.g., connected) to the third additional reflective layer.

These and/or other aspects will become apparent and more readily appreciated from the following description of the embodiments, the accompanying drawings, and claims.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
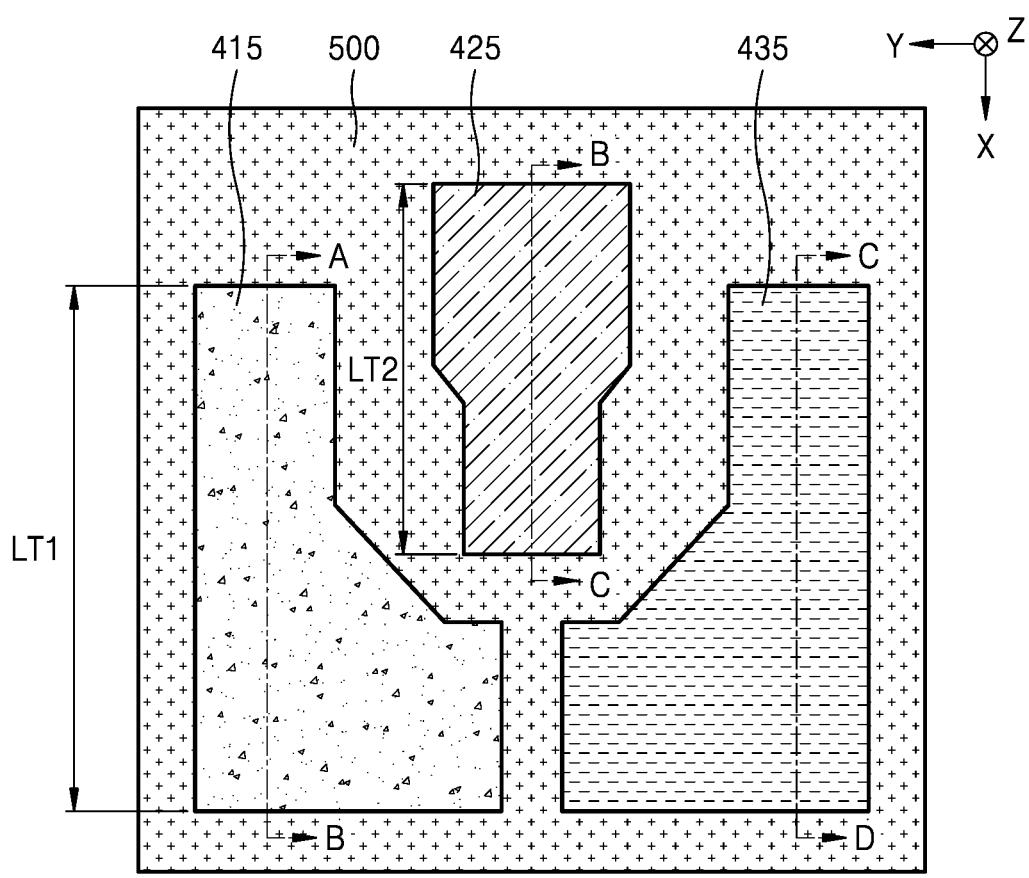
FIG. 1 is a backside view of a portion of a display apparatus according to an embodiment.

Reference will now be made in more detail to some embodiments of the disclosure, examples of which are illustrated in the accompanying drawings, wherein like reference numerals refer to like elements throughout. In this regard, the present embodiments may have different suitable forms and should not be construed as being limited to the descriptions set forth herein. Accordingly, the disclosed embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various suitable changes and numerous embodiments, certain embodiments will be illustrated in the drawings and described in the written description. Aspects and features of the disclosure, and methods for achieving them will become more apparent with reference to embodiments described below in more detail with reference to the drawings. However, the disclosure is not limited to the following disclosed embodiments and may be embodied in various suitable forms. As used herein, the use of the term "may," when describing embodiments of the present disclosure, refers to "one or more embodiments of the present disclosure."

Hereinafter, embodiments will be described with reference to the accompanying drawings, wherein like reference numerals refer to like elements throughout and a repeated description thereof may not be provided.

It will be understood that when a layer, region, or element is referred to as being "on" another layer, area, or element, it can be directly or indirectly on the other layer, region, or element. For example, one or more intervening layers, regions, and/or elements may be present. Sizes of elements in the drawings may be exaggerated for convenience of explanation. For example, because sizes and thicknesses of elements in the drawings may be exaggerated for convenience of explanation, the disclosure is not limited thereto. As used herein, the term "substantially," "about," "approximately," and similar terms are used as terms of approximation and not as terms of degree, and are intended to account for the inherent deviations in measured or calculated values that would be recognized by those of ordinary skill in the art.

In the following examples, the X-axis, the Y-axis, and the Z-axis are not limited to three axes of the rectangular coordinate system, and may be interpreted in a broader sense. For example, the X-axis, the Y-axis, and the Z-axis may be perpendicular to one another or may represent different directions that are not perpendicular to one another.

Figure 2:
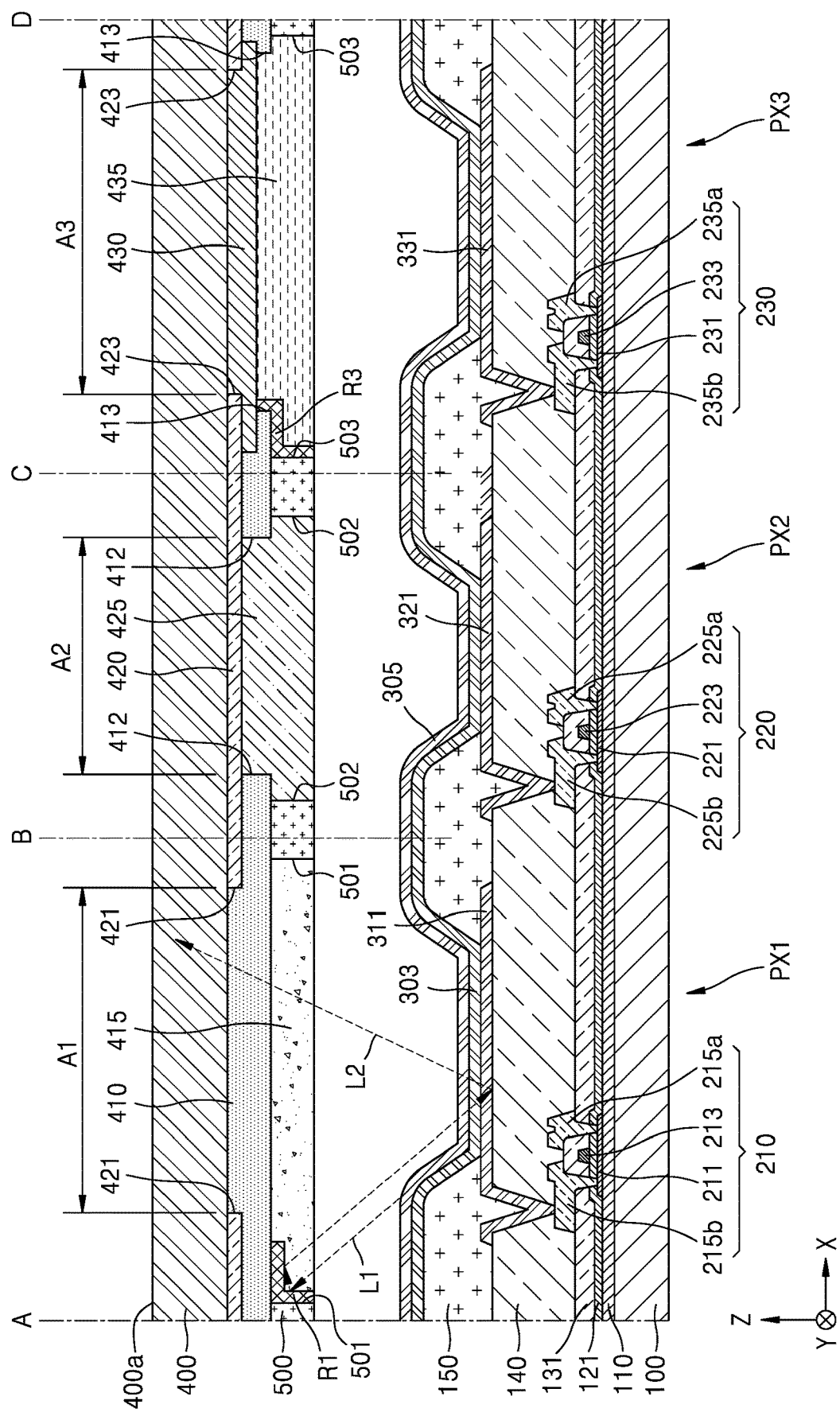
FIG. 2 is a cross-sectional view of the display apparatus taken along lines A-B, B-C, and C-D of FIG. 1.

FIG. 1 is a backside view of a portion of a display apparatus (e.g., a plan view of the portion of the display apparatus from below the display apparatus) according to an embodiment, and FIG. 2 is a cross-sectional view of the display apparatus taken along lines A-B, B-C, and C-D of FIG. 1.

The display apparatus according to the present embodiment includes a bottom substrate 100, a first light-emitting element arranged over the bottom substrate 100, a top substrate 400, a first-color color filter layer 410, a second-color color filter layer 420, a bank 500, a first-color quantum dot layer 415, and a first reflective layer R1.

The bottom substrate 100 may include (e.g., be) glass, metal, and/or a polymer resin. In the case where the bottom substrate 100 is flexible and/or bendable, the bottom substrate 100 may include (e.g., be) a polymer resin including (e.g., being) polyethersulfone, polyacrylate, polyetherimide, polyethylene naphthalate, polyethylene terephthalate, polyphenylene sulfide, polyarylate, polyimide, polycarbonate, and/or cellulose acetate propionate. The bottom substrate 100 may have a multi-layered structure including two layers, each including (e.g., being) the polymer resin, and a barrier layer arranged therebetween and including (e.g., being) an inorganic material (such as silicon oxide, silicon nitride, and/or silicon oxynitride). Various suitable modifications may be made.

The first light-emitting element may be arranged over the bottom substrate 100, the first light-emitting element including a first pixel electrode 311. Besides the first light-emitting element, a first thin-film transistor 210 may be arranged over the bottom substrate 100, the first thin-film transistor 210 being electrically coupled (e.g., connected) to the first light-emitting element. As shown in FIG. 2, when the first light-emitting element is electrically coupled (e.g., connected) to the first thin-film transistor 210, it may mean that the first pixel electrode 311 of the first light-emitting element is electrically coupled (e.g., connected) to the first thin-film transistor 210.

The first thin-film transistor 210 may include a first semiconductor layer 211, a first gate electrode 213, a first source electrode 215a, and a first drain electrode 215b. The first semiconductor layer 211 may include (e.g., be) amorphous silicon, polycrystalline silicon, an organic semiconductor material, and/or an oxide semiconductor material. The first gate electrode 213 may include (e.g., be) various suitable conductive materials and have various suitable layered structures and include, for example, a molybdenum (Mo) layer and/or an aluminum (Al) layer. In this case, the first gate electrode 213 may have a layered structure of Mo/Al/Mo. In some embodiments, the first gate electrode 213 may include (e.g., be) a titanium nitride ($TiN_x$) layer, an Al layer, and/or a Ti layer. The first source electrode 215*a* and the first drain electrode 215*b* may include (e.g., be) various suitable conductive materials and have various suitable layered structures and include, for example, a Ti layer, an Al layer, and/or a Cu layer. In this case, the first source electrode 215*a* and/or the first drain electrode 215*b* may each have a layered structure of Ti/Al/Ti.

To secure insulation between the first semiconductor layer 211 and the first gate electrode 213, a gate insulating layer 121 may be arranged between the first semiconductor layer 211 and the first gate electrode 213, the gate insulating layer 121 including (e.g., being) an inorganic material such as silicon oxide, silicon nitride, and/or silicon oxynitride. An interlayer insulating layer 131 may be arranged on the first gate electrode 213, the interlayer insulating layer 131 including (e.g., being) an inorganic material such as silicon oxide, silicon nitride, and/or silicon oxynitride. The first source electrode 215*a* and the first drain electrode 215*b* may be arranged on the interlayer insulating layer 131. The insulating layer including (e.g., being) the inorganic material (e.g., the gate insulating layer 121 and/or the interlayer insulating layer 131) may be formed through chemical vapor deposition (CVD) and/or atomic layer deposition (ALD). This may also apply to embodiments below and modifications thereof.

A buffer layer 110 may be arranged between the first thin-film transistor 210 and the bottom substrate 100, the buffer layer 110 including (e.g., being) an inorganic material such as silicon oxide, silicon nitride, and/or silicon oxynitride. The buffer layer 110 may increase the flatness of the top surface of the bottom substrate 100 and/or prevent or reduce the penetration of impurities from the bottom substrate 100, etc. into the first semiconductor layer 211 of the first thin-film transistor 210.

A planarization layer 140 may be arranged on the first thin-film transistor 210. As an example, as shown in FIG. 2, in the case where an organic light-emitting element as the first light-emitting element is arranged over the first thin-film transistor 210, the planarization layer 140 may generally planarize a top portion of a protective layer covering the first thin-film transistor 210. The planarization layer 140 may include (e.g., be) an organic material, for example, acryl, benzocyclobutene (BCB) and/or hexamethyldisiloxane (HMDSO). Though it is shown in FIG. 2 that the planarization layer 140 is a single layer, the planarization layer 140 may be a multi-layer. Various suitable modifications may be made.

The first light-emitting element may be arranged on the planarization layer 140 over the bottom substrate 100. It is shown in FIG. 2 that the organic light-emitting element as the first light-emitting element is arranged on the planarization layer 140. The first light-emitting element arranged in a first pixel PX1 may be an organic light-emitting element including the first pixel electrode 311, an opposite electrode 305, and an intermediate layer 303, the intermediate layer 303 being between the first pixel electrode 311 and the opposite electrode 305 and including a second-color emission layer. As shown in FIG. 2, the first pixel electrode 311 is electrically coupled (e.g., connected) to the first thin-film transistor 210 by contacting one of the first source electrode 215*a* or the first drain electrode 215*b* through an opening (e.g., contact hole) formed in the planarization layer 140. The first pixel electrode 311 may include a light transmissive conductive layer and a reflective layer, the light transmissive conductive layer including (e.g., being) a light transmissive conductive oxide such as indium tin oxide (ITO), indium oxide ($In_2O_3$), and/or indium zinc oxide (IZO), and the reflective layer including (e.g., being) metal such as Al and/or silver (Ag). As an example, the first pixel electrode 311 may have a three-layered structure of ITO/Ag/ITO. The first pixel electrode 311 may be a reflective electrode.

Though the intermediate layer 303 including the second-color emission layer may have a shape patterned to correspond to the first pixel electrode 311, the intermediate layer 303 is not limited thereto. For example, the intermediate layer 303 may be arranged also on a second pixel electrode 321 and a third pixel electrode 331 over the bottom substrate 100, and thus, formed as one body over the first pixel electrode 311, the second pixel electrode 321, and the third pixel electrode 331, as shown in FIG. 2. The opposite electrode 305 on the intermediate layer 303 may be also formed as one body over the first pixel electrode 311, the second pixel electrode 321, and the third pixel electrode 331. The opposite electrode 305 may include a light transmissive conductive layer and a semi-transmissive layer, the light transmissive conductive layer including indium (e.g., being) tin oxide (ITO), indium oxide ($In_2O_3$), and/or indium zinc oxide (IZO), and the semi-transmissive layer including (e.g., being) a metal such as Al and/or Ag. As an example, the opposite electrode 305 may include a semi-transmissive layer including (e.g., being) MgAg.

A pixel-defining layer 150 may be arranged on the planarization layer 140. The pixel-defining layer 150 defines a pixel by having an opening corresponding to each pixel, for example, an opening that exposes the central portion of the first pixel electrode 311. For example, the pixel-defining layer 150 may cover a portion (e.g., an edge) of the first pixel electrode 311 and may expose another portion (e.g., a center portion) of the first pixel electrode 311. In addition, in the case shown in FIG. 2, the pixel-defining layer 150 prevents an arc, etc. from occurring, or suppresses the formation of an arc, etc., at the edges of the first pixel electrode 311 by increasing a distance between the edges of the first pixel electrode 311 and the opposite electrode 305. The pixel-defining layer 150 may include (e.g., be) an organic material such as polyimide and/or HMDSO.

The intermediate layer 303 may include (e.g., be) a low molecular weight material and/or a polymer material. In the case where the intermediate layer 303 includes (e.g., is) a low molecular weight material, the intermediate layer 303 may have a structure in which a hole injection layer (HIL), a hole transport layer (HTL), an emission layer (EML), an electron transport layer (ETL), an electron injection layer (EIL), etc. are stacked in a single or composite configuration and may be formed through vacuum deposition. In the case where the intermediate layer 303 includes (e.g., is) a polymer material, the intermediate layer 303 may have a structure including an HTL and an EML. In this case, the HTL may include (e.g., be) poly-3,4-ethylene dioxy thiophene (PEDOT), and the EML may include (e.g., be) a polymer material such as a polyphenylene vinylene (PPV)-based material and/or a polyfluorene-based material. The intermediate layer 303 may be formed through screen printing, inkjet printing, a deposition method, and/or laser induced thermal imaging (LITI), etc. The intermediate layer 303 is not limited thereto and may have various suitable structures.

Though the intermediate layer 303 may include a layer which is one body over the first to third pixel electrodes 311, 321, and 331 as described above, the intermediate layer 303 is not limited thereto and may, for example, include a layer patterned to correspond to each of the first to third pixel electrodes 311, 321, and 331. In any case, the intermediate layer 303 includes a second-color emission layer. The second-color emission layer may be provided as one body over the first to third pixel electrodes 311, 321, and 331. In some embodiments, the second-color emission layer may be patterned to correspond to each of the first to third pixel electrodes 311, 321, and 331. The second-color emission layer may emit light in a second wavelength band and may emit light in a wavelength band ranging, for example, from about 450 nm to about 495 nm.

Because the organic light-emitting element may be easily damaged by external moisture and/or oxygen, etc., an encapsulation layer may cover and protect the organic light-emitting element. The encapsulation layer may include a first inorganic encapsulation layer, an organic encapsulation layer, and a second inorganic encapsulation layer. For example, the encapsulation layer may include a stack of the first inorganic encapsulation layer, the organic encapsulation layer, and the second inorganic encapsulation layer.

The top substrate 400 is arranged over the bottom substrate 100 to allow the first light-emitting element having the first pixel electrode 311 to be arranged between the top substrate 400 and the bottom substrate 100. The top substrate 400 may include (e.g., be) a polymer resin. The top substrate 400 may include (e.g., be) a polymer resin including (e.g., being) polyethersulfone, polyacrylate, polyetherimide, polyethylene naphthalate, polyethylene terephthalate, polyphenylene sulfide, polyarylate, polyimide, polycarbonate, and/or cellulose acetate propionate.

The top substrate 400 may have a multi-layered structure including two layers, each including (e.g., being) the polymer resin, and a barrier layer arranged therebetween and including (e.g., being) an inorganic material (such as silicon oxide, silicon nitride, and/or silicon oxynitride). Various suitable modifications may be made. The top substrate 400 may be flexible and/or bendable. The top substrate 400 includes a first region A1 corresponding to the first light-emitting element. When the first region A1 corresponds to the first light-emitting element, it may mean that, when viewed from a direction (a Z-axis direction) normal or perpendicular to a top surface 400a of the top substrate 400, the first region A1 overlaps the first pixel electrode 311. For example, when viewed in the plan view from above the display apparatus, the first region A1 may overlap the first pixel electrode 311.

The second-color color filter layer 420 is arranged on the bottom surface of the top substrate 400 in a direction facing the bottom substrate 100. The second-color color filter layer 420 may be a layer that transmits only light in a wavelength band of about 450 nm to about 495 nm. The second-color color filter layer 420 may reduce external light reflection in the display apparatus. As shown in FIG. 2, the second-color color filter layer 420 has a 2-$1^{st}$ opening 421 that exposes the first region A1. The 2-$1^{st}$ opening 421 may define a region of a first-color pixel. This will be described later below.

The first-color color filter layer 410 may transmit only light in a wavelength band of about 495 nm to about 570 nm. The first-color color filter layer 410 includes a portion arranged on the bottom surface of the second-color color filter layer 420 in a direction (a −Z-axis direction) facing the bottom substrate 100, and a portion in (e.g., filling) the 2-$1^{st}$ opening 421 of the second-color color filter layer 420. For example, the first-color color filter layer 410 may be in (e.g., may fill) the 2-$1^{st}$ opening 421 of the second-color color filter layer 420 and may cover a portion (e.g., an edge) of a bottom surface of the second-color color filter layer 420. The portion of the first-color color filter layer 410, which is the portion in (e.g., filling) the 2-$1^{st}$ opening 421 of the second-color color filter layer 420, may be arranged on the bottom surface of the top substrate 400 in the direction (the −Z-axis direction) facing the bottom substrate 100.

The bank 500 is arranged between the first-color color filter layer 410 and the second-color color filter layer 420, and the bottom substrate 100. For example, the bank 500 may be under the first-color color filter layer 410 and under the second-color color filter layer 420. The bank 500 has a first opening 501 corresponding to the first region A1. However, when viewed from the direction (the Z-axis direction) perpendicular to the bottom surface of the top substrate 400 (e.g., when viewed in the plan view from below the display apparatus), the first opening 501 of the bank 500 does not completely coincide with the first region A1. For example, when viewed from the direction (the Z-axis direction) normal or perpendicular to the bottom surface of the top substrate 400 (e.g., when viewed in the plan view from below the display apparatus), the first opening 501 of the bank 500 includes a 1-$1^{st}$ portion overlapping the 2-$1^{st}$ opening 421 of the second-color color filter layer 420, and a 1-$2^{nd}$ portion outside the 2-$1^{st}$ opening 421. For example, when viewed in the plan view from below the display apparatus, the 1-$2^{nd}$ portion of the first opening 501 may overlap a portion (e.g., an edge) of the second-color color filter layer 420 adjacent to the 2-$1^{st}$ opening 421 of the second-color color filter layer 420.

For reference, the first opening 501 of the bank 500 may correspond to (e.g., overlap in the plan view) the opening of the pixel-defining layer 150 defining the region of the first pixel PX1. However, as shown in FIG. 2, when viewed from the direction (the Z-axis direction) perpendicular to the top surface 400a of the top substrate 400 (e.g., when viewed in the plan view from above the display apparatus), a breadth and/or area of the first opening 501 of the bank 500 may be greater than a breadth and/or area of the opening of the pixel-defining layer 150 defining the region of the first pixel PX1. For example, when the first opening 501 of the bank 500 corresponds to the opening of the pixel-defining layer 150 defining the region of the first pixel PX1, it may mean that, when viewed from the direction (the Z-axis direction) perpendicular to the top surface 400a of the top substrate 400 (e.g., when viewed in the plan view from above the display apparatus), the shape of the edges of the first opening 501 of the bank 500 may be the same as or similar to the shape of the edges of the opening of the pixel-defining layer 150 defining the region of the first pixel PX1.

The bank 500 may include (e.g., be) various suitable materials and may include (e.g., be) an inorganic material such as silicon oxide, silicon nitride, and/or silicon oxynitride. The bank 500 may include (e.g., be) a photoresist material. With this, the bank 500 may be easily formed through a process such as an exposure and developing process.

The first-color quantum dot layer 415 is in (e.g., fills) the first opening 501 of the bank 500. The first-color quantum dot layer 415 may convert light in a second wavelength band generated from the intermediate layer 303 on the first pixel electrode 311 into light in a first wavelength band. As an example, when light in a wavelength band of about 450 nm to about 495 nm is generated from the intermediate layer 303 on the first pixel electrode 311, the first-color quantum dot layer 415 may convert this light into light in a wavelength band of about 495 nm to about 570 nm. Accordingly, in the first pixel PX1, light in the wavelength band of about 495 nm to about 570 nm is emitted to the outside through the top substrate 400.

The first-color quantum dot layer 415 may have a configuration in which quantum dots are dispersed in a resin. The quantum dot may include (e.g., be) a semiconductor material such as cadmium sulfide (CdS), cadmium telluride (CdTe), zinc sulfide (ZnS), and/or indium phosphide (InP). A size of the quantum dot may be several nanometers, and the wavelength of light after conversion is changed depending on the size of the quantum dot. Any suitable light-transmissive material may be utilized as far as the light-transmissive material is included in the first-color quantum dot layer 415. As an example, a polymer resin such as acryl, BCB, or HMDSO may be utilized as a material for forming the first-color quantum dot layer 415. The material for forming the first-color quantum dot layer 415 may be arranged inside the first opening 501 of the bank 500 through inkjet printing.

The first reflective layer R1 is arranged on the inner surface of the first opening 501 of the bank 500. The first reflective layer R1 may include (e.g., be) a material having desired or excellent reflectivity such as metal and may include (e.g., be), for example, Al and/or Ag. In addition, as shown in FIG. 2, the first reflective layer R1 may be arranged also on a portion of the top surface of the first-color quantum dot layer 415 in a direction (a +Z-axis direction) facing the top substrate 400. In an embodiment, the first reflective layer R1 is arranged on a portion of the top surface of the first-color quantum dot layer 415 in the direction (the +Z-axis direction) facing the top substrate 400, the portion being a portion of the first opening 501 of the bank 500 and corresponding to the 1-$2^{nd}$ portion outside the 2-$1^{st}$ opening 421 of the second-color color filter layer 420. In some embodiments, one portion of the first reflective layer R1 may be along an inner sidewall of the bank 500 that forms the first opening 501, and another portion of the first reflective layer R1 coupled (e.g., connected) to and/or extending from the one portion may be on a portion of the top surface of the first-color quantum dot layer 415. In some embodiments, the other portion of the first reflective layer R1 is under (e.g., directly under) the first-color color filter layer 410 and overlaps the second-color color filter layer 420 and does not overlap the 2-$1^{st}$ opening 421. In some embodiments, the first reflective layer R1 may have an inverted L-shape, which, for example, may be arranged in a corner formed by a junction between the inner sidewall of the bank 500 that forms the first opening 501 and along a bottom surface of a layer directly above the bank 500 and/or the first-color quantum dot layer 415 (e.g., the first-color color filter layer 410).

As described above, the second-color color filter layer 420 may reduce external light reflection in the display apparatus. As an example, when external light reaches the second-color color filter layer 420, only light having the wavelength set in advance described above (e.g., set in the second wavelength band) passes through the second-color color filter layer 420, and light having other wavelengths is absorbed in the second-color color filter layer 420. Accordingly, among external light incident onto the display apparatus, only light having the wavelength set in advance (e.g., set in the second wavelength band) passes through the second-color color filter layer 420, and a portion of the light is reflected by the opposite electrode 305 or by the first pixel electrode 311 therebelow and emitted to the outside. As a result, only a portion of external light incident on where the first pixel PX1 is located is reflected to the outside, and thus, external light reflection may be reduced.

The second-color emission layer of the first light-emitting element may emit light in the second wavelength band. The first-color quantum dot layer 415 may convert light in the second wavelength band into light having a wavelength band of about 495 nm to about 570 nm, which may be the first wavelength band. This light progresses to the outside through the first-color color filter layer 410 and the top substrate 400. However, among this light, light incident onto the second-color color filter layer 420 cannot pass through the second-color color filter layer 420.

In contrast, in the display apparatus according to the present embodiment, as shown in FIG. 2, when light L1 passing through the first-color quantum dot layer 415 and having a wavelength in the first wavelength band progresses toward the second-color color filter layer 420, the first reflective layer R1 reflects at least a portion of the light L1. As a result, the light L1 is allowed to pass through the first-color color filter layer 410 and the top substrate 400 and become light L2 progressing to the outside. During this process, light progressing toward the bottom substrate 100 may be reflected also by the opposite electrode 305 or by the first pixel electrode 311. Therefore, light efficiency may be remarkably increased.

As described above, the first reflective layer R1 may reflect light having a wavelength in the first wavelength band that progresses toward the second-color color filter layer 420. For this purpose, as described above, the first reflective layer R1 is arranged on the inner surface of the first opening 501 of the bank 500. In addition, as shown in FIG. 2, the first reflective layer R1 may be arranged on a portion of the top surface of the first-color quantum dot layer 415 in the direction (the +Z-axis direction) facing the top substrate 400. Here, the portion of the top surface of the first-color quantum dot layer 415 is a portion of (e.g., in) the first opening 501 of the bank 500 and denotes a portion of the top surface of the first-color quantum dot layer 415 in the direction (the +Z-axis direction) facing the top substrate 400, the portion corresponding to the 1-$2^{nd}$ portion outside the 2-$1^{st}$ opening 421 of the second-color color filter layer 420.

Though the first reflective layer R1 may be arranged on the entire inner surface of the first opening 501 of the bank 500, as shown in FIG. 2, the first reflective layer R1 may be arranged on a portion (e.g., on only a portion) of the inner surface of the first opening 501. When viewed from the direction (the −Z-axis direction) perpendicular to the bottom surface of the top substrate 400 (e.g., when viewed in the plan view from below the display apparatus), as shown in FIG. 1, the first opening 501 of the bank 500 includes a portion protruding in one direction (an −X-axis direction) defined in a virtual plane (an XY-plane) parallel to the bottom surface of the top substrate 400 in a direction facing the bottom substrate 100. The first reflective layer R1 may be arranged to correspond to the protruding portion of the first opening 501. It is shown in FIG. 2 that the first reflective layer R1 is arranged around a mark "A" corresponding to the protruding portion of the first opening 501 shown in FIG. 1. This will be described later below.

As shown in FIGS. 1 and 2, the display apparatus according to the present embodiment may include a second light-emitting element arranged in a second pixel PX2. As shown in FIG. 2, the second light-emitting element may be an organic light-emitting element including the second pixel electrode 321, the opposite electrode 305, and the intermediate layer 303, the intermediate layer 303 being arranged therebetween and including a second-color emission layer. Besides the second light-emitting element, a second thin-film transistor 220 may be arranged over the bottom substrate 100, the second thin-film transistor 220 being electrically coupled (e.g., connected) to the second light-emitting element. As shown in FIG. 2, when the second light-emitting element is electrically coupled (e.g., connected) to the second thin-film transistor 220, it may mean that the second pixel electrode 321 of the second light-emitting element is electrically coupled (e.g., connected) to the second thin-film transistor 220. The descriptions of the second pixel electrode 321 and the second thin-film transistor 220 are the same as those of the first pixel electrode 311 and the first thin-film transistor 210, respectively.

The second-color color filter layer 420 covers a second region A2 of the top substrate 400 corresponding to the second light-emitting element. When the second region A2 corresponds to the second light-emitting element, it may mean that, when viewed from the direction (the Z-axis direction) normal or perpendicular to the top substrate 400 (e.g., when viewed in the plan view), the second region A2 overlaps the second pixel electrode 321. The first-color color filter layer 410 has a $1\text{-}2^{nd}$ opening 412 corresponding to the second region A2. In addition, the bank 500 has a second opening 502 corresponding to the second region A2. In this case, when viewed from the direction (the Z-axis direction) normal or perpendicular to the bottom surface of the top substrate 400 (e.g., when viewed in the plan view from below the display apparatus), the second opening 502 of the bank 500 includes a portion overlapping the $1\text{-}2^{nd}$ opening 412 of the first-color color filter layer 410, and a portion outside the $1\text{-}2^{nd}$ opening 412.

The second-color emission layer of the intermediate layer 303 of the second pixel PX2 may emit light in the second wavelength band and emit light in a wavelength band ranging, for example, from about 450 nm to about 495 nm. The second pixel PX2 emits the light in the second wavelength band to the outside through the top substrate 400 without wavelength conversion. Therefore, in some embodiments, the second pixel PX2 does not include a quantum dot layer. Because the quantum dot layer is not required in the second opening 502 of the bank 500 as described above, a light transmissive layer 425 including (e.g., being) a light transmissive resin is arranged in the second opening 502. The light transmissive layer 425 may include (e.g., be) acryl, BCB, and/or HMDSO. In some embodiments, there may be no light transmissive layer 425 in the second opening 502 of the bank 500.

As shown in FIGS. 1 and 2, the display apparatus according to the present embodiment may include a third light-emitting element arranged in a third pixel PX3. As shown in FIG. 2, the third light-emitting element may be an organic light-emitting element including the third pixel electrode 331, the opposite electrode 305, and the intermediate layer 303, the intermediate layer 303 being arranged therebetween and including the second-color emission layer. Besides the third light-emitting element, a third thin-film transistor 230 may be arranged over the bottom substrate 100, the third thin-film transistor 230 being electrically coupled (e.g., connected) to the third light-emitting element. As shown in FIG. 2, when the third light-emitting element is electrically coupled (e.g., connected) to the third thin-film transistor 230, it may mean that the third pixel electrode 331 of the third light-emitting element is electrically coupled (e.g., connected) to the third thin-film transistor 230. The descriptions of the third pixel electrode 331 and the third thin-film transistor 230 are the same as those of the first pixel electrode 311 and the first thin-film transistor 210, respectively.

As shown in FIG. 2, the second-color color filter layer 420 has a $2\text{-}3^{rd}$ opening 423 that exposes a third region A3 of the top substrate 400 corresponding to the third light-emitting element. When the third region A3 corresponds to the third light-emitting element, it may mean that, when viewed from the direction (the Z-axis direction) perpendicular to the top substrate 400 (e.g., when viewed in the plan view), the third region A3 overlaps the third pixel electrode 331. In addition, as shown in FIG. 2, the first-color color filter layer 410 also has a $1\text{-}3^{rd}$ opening 413 that corresponds to the third region A3. As shown in FIG. 2, the third-color color filter layer 430 is in (e.g., fills) the $2\text{-}3^{rd}$ opening 423 of the second-color color filter layer 420. It may be understood that the third-color color filter layer 430 is in (e.g., fills) the $1\text{-}3^{rd}$ opening 413 of the first-color color filter layer 410. The third-color color filter layer 430 may transmit only light having a wavelength of about 630 nm to about 780 nm.

As shown in FIG. 2, the bank 500 has a third opening 503 corresponding to the third region A3. In this case, when viewed from the direction (the Z-axis direction) normal or perpendicular to the bottom surface of the top substrate 400 (e.g., when viewed in the plan view from below the display apparatus), the third opening 503 of the bank 500 includes a $3\text{-}1^{st}$ portion overlapping the $2\text{-}3^{rd}$ opening 423 of the second-color color filter layer 420, and a $3\text{-}2^{nd}$ portion outside the $2\text{-}3^{rd}$ opening 423. For example, in some embodiments, the $3\text{-}2^{nd}$ portion does not overlap the $2\text{-}3^{rd}$ opening 423.

A third-color quantum dot layer 435 is in (e.g., fills) the third opening 503 of the bank 500. The third-color quantum dot layer 435 may convert light in a second wavelength band generated from the intermediate layer 303 on the third pixel electrode 331 into light in a third wavelength band. As an example, when light having a wavelength of about 450 nm to about 495 nm is generated from the intermediate layer 303 on the third pixel electrode 331, the third-color quantum dot layer 435 may convert this light into light having a wavelength of about 630 nm to about 780 nm. Accordingly, in the third pixel PX3, light having a wavelength of about 630 nm to about 780 nm is emitted to the outside through the top substrate 400.

The third-color quantum dot layer 435 may have a configuration in which quantum dots are dispersed in a resin. The quantum dot may include (e.g., be) a semiconductor material such as cadmium sulfide (CdS), cadmium telluride (CdTe), zinc sulfide (ZnS), and/or indium phosphide (InP). A size of the quantum dot may be several nanometers and the wavelength of light after conversion is changed depends on the size of the quantum dot. Any suitable light-transmissive material may be utilized as far as the light-transmissive material is included in the third-color quantum dot layer 435. As an example, a polymer resin such as acryl, BCB, and/or HMDSO may be utilized as a material for forming the third-color quantum dot layer 435. The material for forming the third-color quantum dot layer 435 may be arranged inside the third opening 503 of the bank 500 through inkjet printing.

A third reflective layer R3 is arranged on the inner surface of the third opening 503 of the bank 500. The third reflective layer R3 may include (e.g., be) metal having desired or excellent reflectivity and may include (e.g., be), for example, Al and/or Ag. In addition, as shown in FIG. 2, the third reflective layer R3 may be arranged also on a portion of the top surface of the third-color quantum dot layer 435 in the direction (the +Z-axis direction) facing the top substrate 400. In an embodiment, the third reflective layer R3 is arranged on a portion of the top surface of the third-color quantum dot layer 435 in the direction (the +Z-axis direction) facing the top substrate 400, the portion being a portion of the third opening 503 of the bank 500 and corresponding to the 3-$2^{nd}$ portion outside the 2-$3^{rd}$ opening 423 of the second-color color filter layer 420. In some embodiments, a first portion of the third reflective layer R3 may be along an inner sidewall of the bank 500 that forms the third opening 503, and a second portion of the third reflective layer R3 coupled (e.g., connected) to and/or extending from the first portion may be on a portion of the top surface of the third-color quantum dot layer 435. In some embodiments, the second portion of the third reflective layer R3 is under (e.g., directly under) the first-color color filter layer 410 and overlaps the second-color color filter layer 420 and does not overlap the 2-$3^{rd}$ opening 423. In some embodiments, the first and second portions of the third reflective layer R3 may form an inverted L-shape, which, for example, may be arranged along a corner formed by a junction defined by the inner sidewall of the bank 500 that forms the third opening 503 and along a bottom surface of a layer immediately above the bank 500 and/or the third-color quantum dot layer 435 (e.g., the first-color color filter layer 410). In some embodiments, the third reflective layer R3 may include a third portion coupled (e.g., connected) to and/or extending from the second portion along a sidewall of the third-color quantum dot layer 435 and/or along an inner sidewall of the first-color color filter layer 410 that forms the 1-$3^{rd}$ opening 413 of the first-color color filter layer 410.

As described above, the second-color color filter layer 420 may reduce external light reflection in the display apparatus. As an example, when external light reaches the second-color color filter layer 420, only light having the wavelength set in advance described above (e.g., set in the second wavelength band) passes through the second-color color filter layer 420, and light having other wavelengths is absorbed in the second-color color filter layer 420. Accordingly, among external light incident onto the display apparatus, only light having the wavelength set in advance (e.g., set in the second wavelength band) passes through the second-color color filter layer 420, and a portion of the light is reflected by the opposite electrode 305 or by the first pixel electrode 311 therebelow and emitted to the outside. As a result, only a portion of external light incident at (e.g., on) where the third pixel PX3 is located is reflected to the outside, and thus, external light reflection may be reduced.

The second-color emission layer of the third light-emitting element may emit light in the second wavelength band. The third-color quantum dot layer 435 may convert light in the second wavelength band into light in a wavelength band of about 630 nm to about 780 nm, which may be the third wavelength band. This light progresses to the outside through the third-color color filter layer 430 and the top substrate 400. However, among this light, light incident onto the second-color color filter layer 420 cannot pass through the second-color color filter layer 420.

In contrast, in the display apparatus according to the present embodiment, as shown in FIG. 2, when light passing through the third-color quantum dot layer 435 and having a wavelength in the third wavelength band progresses toward the second-color color filter layer 420, the third reflective layer R3 reflects at least a portion of the light. As a result, the light is allowed to pass through the third-color color filter layer 430 and the top substrate 400 and become light progressing to the outside. During this process, light progressing toward the bottom substrate 100 may be reflected also by the opposite electrode 305 or the first pixel electrode 311. Therefore, light efficiency may be remarkably increased. For example, the third reflective layer R3 may reflect at least a portion of the light emitted from the second-color emission layer of the third light emitting element and converted by the third-color quantum dot layer 435 into light of the third wavelength band back toward the third light emitting element, and the portion of the reflected light may be reflected again by the opposite electrode 305 or by the first pixel electrode 311 to progress through the third-color color filter layer 430 and to the outside.

As described above, the third reflective layer R3 should reflect light having a wavelength in the third wavelength band that progresses toward the second-color color filter layer 420. For this purpose, as described above, the third reflective layer R3 is arranged on the inner surface of the third opening 503 of the bank 500. In addition, as shown in FIG. 2, the third reflective layer R3 may be arranged also on a portion of the top surface of the third-color quantum dot layer 435 in the direction (the +Z-axis direction) facing the top substrate 400. Here, the portion of the top surface of the third-color quantum dot layer 435 is a portion of (e.g., in) the third opening 503 of the bank 500 and denotes a portion of the top surface of the third-color quantum dot layer 435 in the direction (the +Z-axis direction) facing the top substrate 400, the portion corresponding to the 3-$2^{nd}$ portion outside the 2-$3^{rd}$ opening 423 of the second-color color filter layer 420.

Though the third reflective layer R3 may be arranged on the entire inner surface of the third opening 503 of the bank 500, as shown in FIG. 2, the third reflective layer R3 may be arranged on a portion (e.g., on only a portion) of the inner surface of the third opening 503. When viewed from the direction (the −Z-axis direction) perpendicular to the bottom surface of the top substrate 400 (e.g., when viewed in the plan view from below the display apparatus), as shown in FIG. 1, the third opening 503 of the bank 500 includes a portion protruding in one direction (the −X-axis direction) defined in the virtual plane (the XY-plane) parallel to the bottom surface of the top substrate 400 in the direction facing the bottom substrate 100. The third reflective layer R3 may be arranged to correspond to the protruding portion of the third opening 503. It is shown in FIG. 2 that the third reflective layer R3 is arranged around a mark "C" corresponding to the protruding portion of the third opening 503 shown in FIG. 1.

During the manufacturing process, the first-color quantum dot layer 415, the third-color quantum dot layer 435, and the light transmissive layer 425 are formed through inkjet printing. In this case, an area (e.g., planar area) in which the first-color quantum dot layer 415 and the third-color quantum dot layer 435 are formed is set (e.g., formed to be) greater than an area (e.g., planar area) in which the light transmissive layer 425 is formed. This is because light efficiencies in the first pixel PX1 to the third pixel PX3 are different from each other. Accordingly, the number of times of dotting a material for forming the first-color quantum dot layer 415 to form the first-color quantum dot layer 415, and the number of times of dotting a material for forming the third-color quantum dot layer 435 to form the third-color quantum dot layer 435 are greater than the number of times of dotting a material for forming the light transmissive layer 425 to form the light transmissive layer 425.

Because inkjet printing may be performed while arranging a plurality of inkjet heads over the top substrate 400 in the Y-axis direction and then moving the plurality of inkjet heads in one direction (an X-axis direction) at a constant speed, when the number of times of dotting a specific or set material in a specific or set region increases, the specific or set region inevitably becomes long in a direction in which the top substrate 400 moves. Accordingly, taking into account this, as shown in FIG. 1, each of the first opening 501 and the third opening 503 of the bank 500 includes, as shown in FIG. 1, a portion protruding in one direction (the −X-axis direction) defined in the virtual plane (the XY-plane) parallel to the bottom surface of the top substrate 400 in a direction facing the bottom substrate 100 when viewed from the direction (the −Z-axis direction) perpendicular to the bottom surface of the top substrate 400 (e.g., when viewed in the plan view from below the display apparatus). It is shown in FIG. 1 that a length LT1 of the first-color quantum dot layer 415 in the direction (the X-axis direction) in which the top substrate 400 moves (e.g., along the top substrate 400) is greater than a length LT2 of the light transmissive layer 425 in the direction (the X-axis direction) in which the top substrate 400 moves (e.g., along the top substrate 400). As a result, as shown in FIG. 1, when viewed from the direction perpendicular to the top substrate 400 (e.g., when viewed in the plan view), the area of the first-color quantum dot layer 415 and the area of the third-color quantum dot layer 435 become very much wider than the area of the light transmissive layer 425 beyond the estimated degree. For example, when viewed in the plan view, a width (e.g., a width along the Y-axis direction) of each of the first-color quantum dot layer 415 and the third-color quantum dot layer 435 may increase along the X-axis direction to become greater than a width (e.g., a width along the Y-axis direction) of the light transmissive layer 425.

External light may be incident onto the display apparatus and be reflected therefrom. For example, external light may be incident onto the first-color color filter layer 410, and light in the first wavelength band may be reflected by the first pixel electrode 311 and then may progress to the outside. External light may be incident onto the second-color color filter layer 420, and light in the second wavelength band may be reflected by the second pixel electrode 321 and then may progress to the outside. External light may be incident onto the third-color color filter layer 430, and light in the third wavelength band may be reflected by the third pixel electrode 331 and then may progress to the outside. In this case, when the amount of light in the first wavelength band reflected by the first pixel electrode 311 and progressing to the outside and the amount of light in the third wavelength band reflected by the third pixel electrode 331 and progressing to the outside are each greater than amount of light in the second wavelength band reflected by the second pixel electrode 321 and progressing to the outside, a user recognizes, as a result, that the reflected external light has a specific or set color. This may cause an issue in which a user recognizes that the color of an image reproduced in the display apparatus is not accurate. As described above, the area of the first-color quantum dot layer 415 and the area of the third-color quantum dot layer 435 become very much wider than the area of the light transmissive layer 425 beyond the estimated degree. Accordingly, it is required or desired that a user is allowed to accurately recognize the color of an image reproduced in (e.g., displayed by) the display apparatus.

For this purpose, even though each of the first opening 501 and the third opening 503 of the bank 500 has a portion protruding in one direction (the −X-axis direction) defined in the virtual plane (the XY-plane) parallel to the bottom surface of the top substrate 400 in the direction facing the bottom substrate 100 as shown in FIG. 1, external light may be prevented or blocked from being reflected at the protruding portion.

In the display apparatus according to the present embodiment, though the first opening 501 of the bank 500 has a portion protruding in one direction (the −X-axis direction) defined in the virtual plane (the XY-plane) parallel to the bottom surface of the top substrate 400 in the direction facing the bottom substrate 100 as shown in FIG. 1, the second-color color filter layer 420 overlaps the first-color color filter layer 410 at the protruding portion. Accordingly, external light may be absorbed by both the second-color color filter layer 420 and the first-color color filter layer 410, and thus, may not nearly be reflected by the first pixel electrode 311. For example, external light incident on the display apparatus at the portion of the first opening 501 where the first-color color filter layer 410 and the second-color color filter layer 420 overlap (e.g., the protruding portion of the first opening 501) may be prevented from being reflected, or the amount of light reflected may be reduced.

In addition, in the case of the light L1 generated from the first pixel PX1, then passing through the first-color quantum dot layer 415, and having the wavelength in the first wavelength band, even though the light L1 progresses toward the protruding portion of the second-color color filter layer 420 (e.g., the portion of the second-color color filter layer 420 that overlaps the protruding portion of the first opening 501), the first reflective layer R1 reflects at least a portion of the light L1, and as a result, the light L1 becomes the light L2 passing through the first-color color filter layer 410 and the top substrate 400 and progressing to the outside. Therefore, light efficiency may be remarkably increased.

This may be equally applied to the third pixel PX3. In the display apparatus according to the present embodiment, though the third opening 503 of the bank 500 has a portion protruding in one direction (the −X-axis direction) defined in the virtual plane (the XY-plane) parallel to the bottom surface of the top substrate 400 in the direction facing the bottom substrate 100 as shown in FIG. 1, the second-color color filter layer 420 overlaps the first-color color filter layer 410 at the protruding portion. Accordingly, external light may be absorbed by the second-color color filter layer 420 and the first-color color filter layer 410, and thus, may not nearly be reflected by the third pixel electrode 331. For example, external light incident on the display apparatus at the portion of the third opening 503 where the first-color color filter layer 410 and the second-color color filter layer 420 overlap (e.g., the protruding portion of the third opening 503) may be prevented from being reflected, or the amount of light reflected may be reduced.

In addition, in the case of the light generated from the third pixel PX3, then passing through the third-color quantum dot layer 435, and having the wavelength in the third wavelength band, even though the light progresses toward the protruding portion of the second-color color filter layer 420 (e.g., the portion of the second-color color filter layer 420 that overlaps the protruding portion of the third opening 503), the third reflective layer R3 reflects at least a portion of the light, and as a result, the light becomes light passing through the third-color color filter layer 430 and the top substrate 400 and progressing to the outside. Therefore, light efficiency may be remarkably increased.

Figure 3:
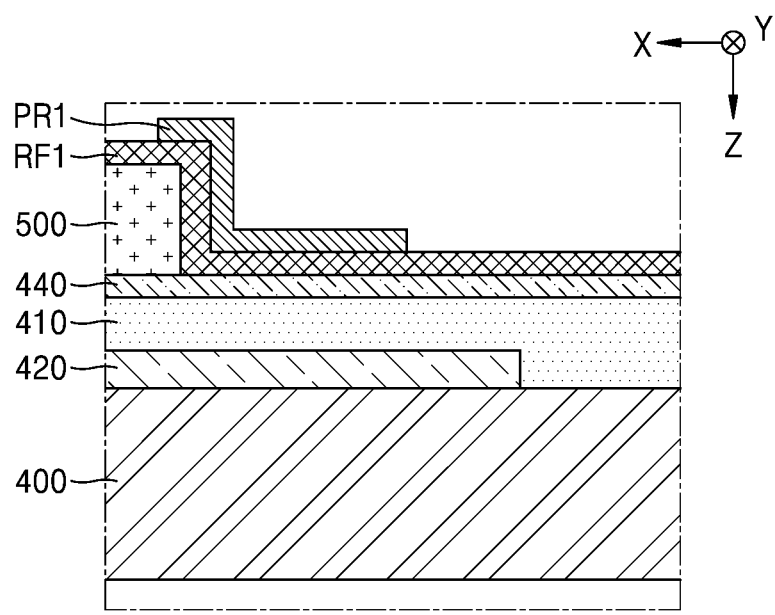
FIGS. 3 to 5 are each a cross-sectional view showing a process of manufacturing a portion of the display apparatus of FIG. 2.
Figure 4:
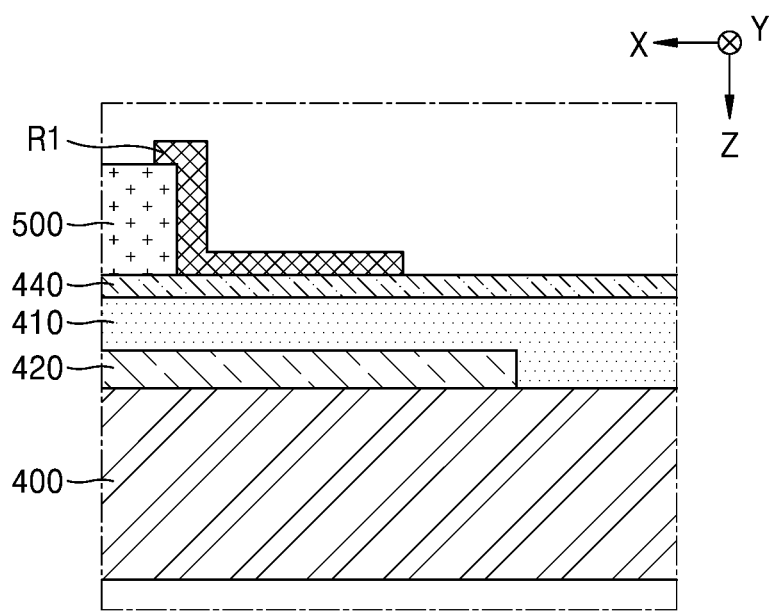
Figure 5:
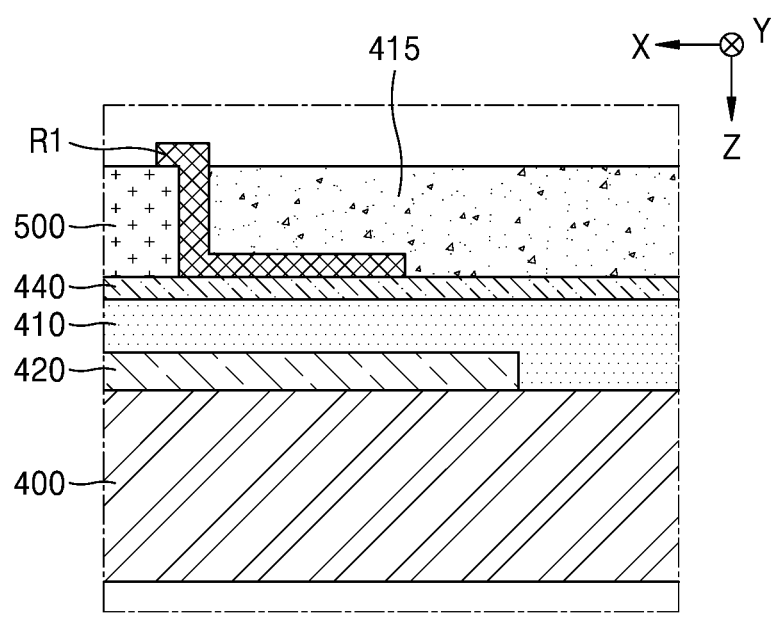

FIGS. 3 to 5 are each a cross-sectional view showing a process of manufacturing a portion of the display apparatus of FIG. 2. In an embodiment, FIGS. 3 to 5 are each a cross-sectional view showing a process of forming the first reflective layer R1 over the top substrate 400.

As shown in FIG. 3, the second-color color filter layer 420, the first-color color filter layer 410, and the bank 500 are formed on the top substrate 400. A low refractive index layer 440 may be arranged between the color filter layer (e.g., the first-color color filter layer 410 and/or the second-color color filter layer 420) and the bank 500 as shown in FIG. 3, the low refractive index layer 440 including (e.g., being) silicon oxide, silicon nitride, and/or silicon oxynitride. In addition, a first reflective material layer RF1 is formed on the top surface of the bank 500, the inner surface of the first opening of the bank 500, and the bottom surface of the first opening in a direction facing the color filter layer through sputtering by utilizing a material for forming the first reflective layer R1. Subsequently, the first reflective layer R1 may be formed as shown in FIG. 4 by forming a photoresist layer PR1 on the first reflective material layer RF1 such that the photoresist layer PR1 is located at (e.g., on) where the first reflective layer is to be formed, removing portions of the first reflective material layer RF1 that are exposed to the outside of the photoresist layer PR1 (e.g., that are not covered by the photoresist layer PR1), and then removing the photoresist layer PR1. In this case, as shown in FIG. 4, there may be the first reflective layer R1 also on a portion of a surface of the bank 500 in a direction opposite to the direction facing the top substrate 400 (e.g., on a portion of a surface of the bank 500 facing oppositely away from the top substrate 400). This is intended to allow the first reflective layer R1 to be properly formed on the inner surface of the first opening and prevent the first reflective layer R1 from being exfoliated from the inner surface of the first opening, or to reduce the exfoliation of the first reflective layer R1 from the inner surface of the first opening.

Then, as shown in FIG. 5, the first-color quantum dot layer 415 may be formed. While the first reflective layer R1 is formed, the third reflective layer R3 may be simultaneously or concurrently formed by utilizing the same material as the first reflective layer R1.

Figure 6:
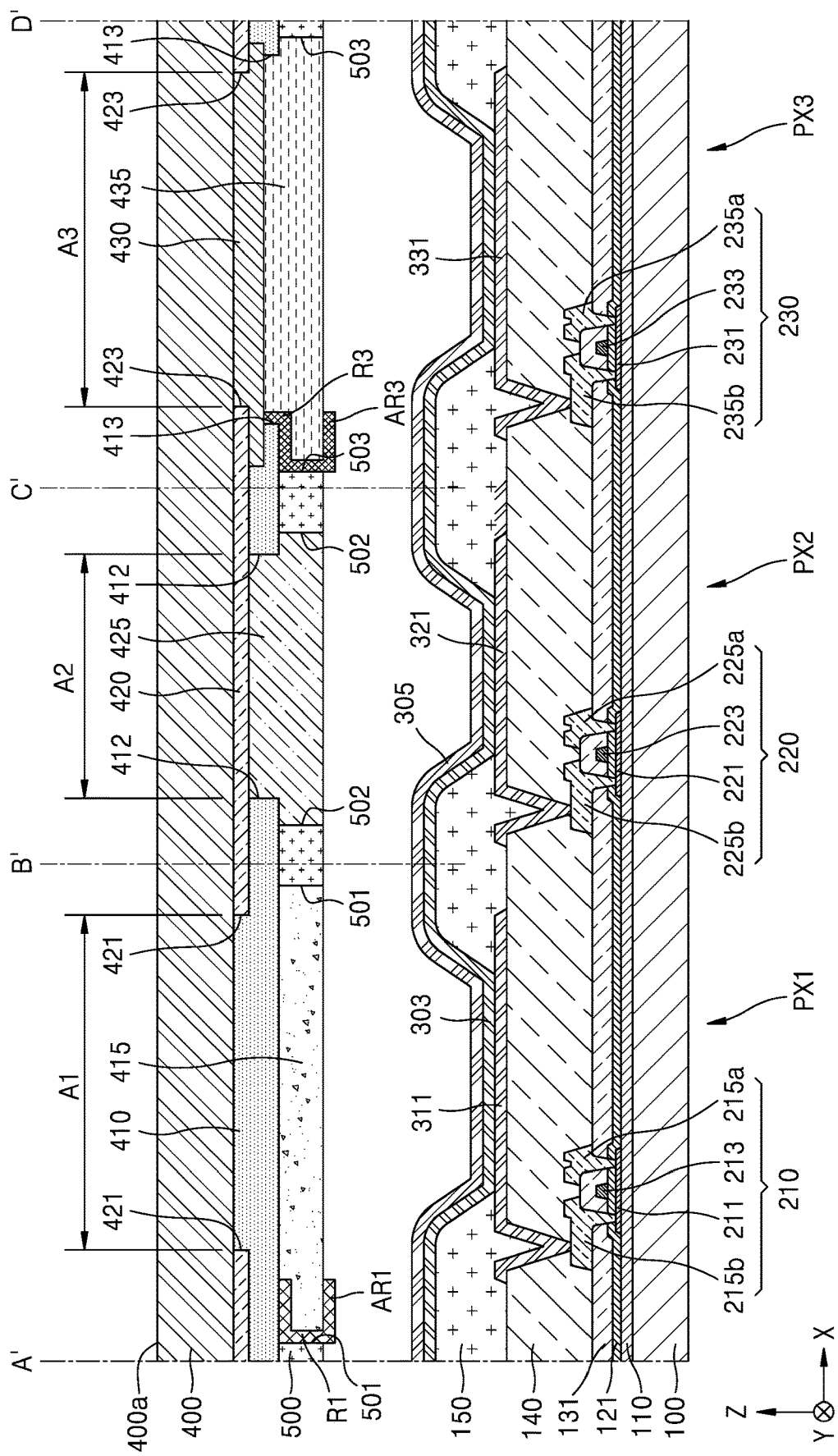
FIG. 6 is a cross-sectional view of a portion of a display apparatus according to another embodiment.
Figure 7:
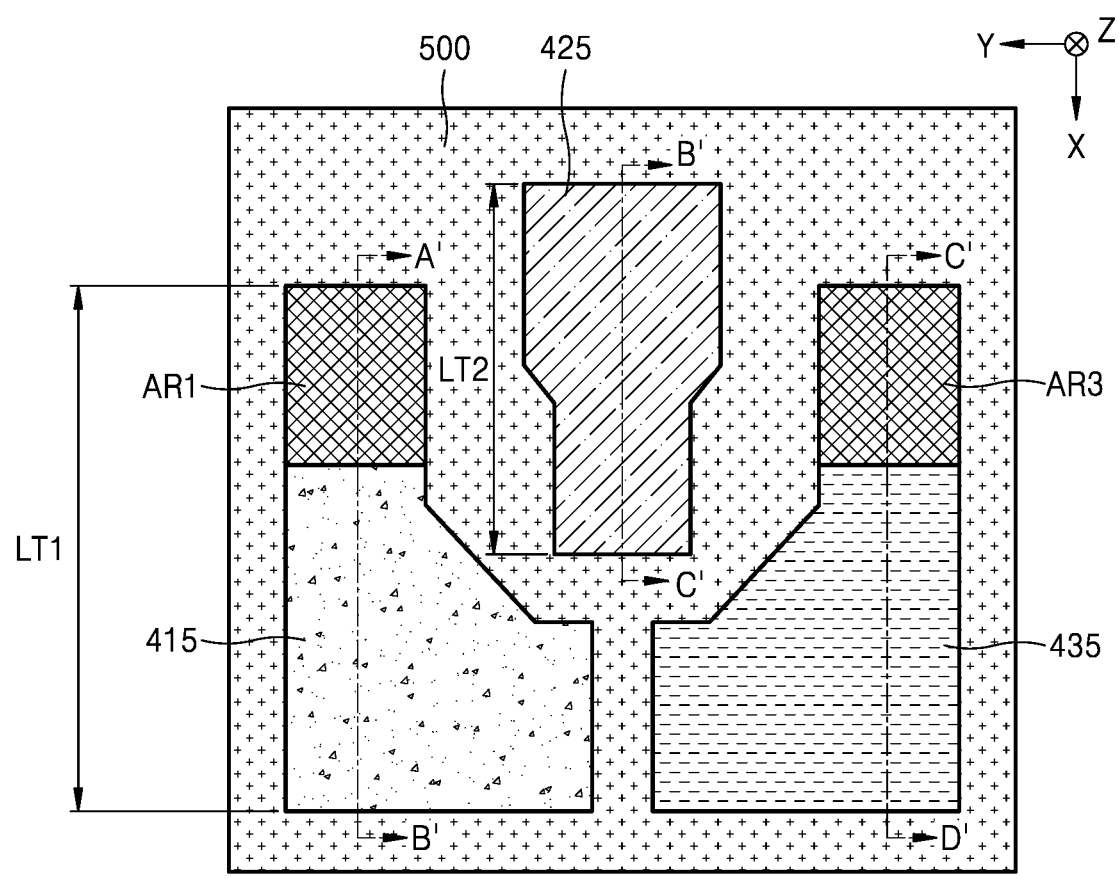
FIG. 7 is a backside view of a portion of the display apparatus of FIG. 6.

FIG. 6 is a cross-sectional view of a portion of a display apparatus according to another embodiment, and FIG. 7 is a backside view (e.g., a plan view from below the display apparatus) of a portion of the display apparatus of FIG. 6. FIG. 6 may be understood as a cross-sectional view of the display apparatus taken along lines A'-B' and B'-C', and C'-D' of FIG. 7.

The display apparatus according to the present embodiment is different from the display apparatus according to the previous embodiment described with reference to FIGS. 1 and 2 in that a first additional reflective layer AR1 and a third additional reflective layer AR3 are further provided.

The first additional reflective layer AR1 is arranged on a portion corresponding to the 1-$2^{nd}$ portion outside the 2-$1^{st}$ opening 421 of the second-color color filter layer 420 in the first opening 501 of the bank 500 and on the bottom surface of the first-color quantum dot layer 415 in the direction (the −Z-axis direction) facing the bottom substrate 100. The first additional reflective layer AR1 may be coupled (e.g., connected, for example, physically or directly connected) to and/or may extend from the first reflective layer R1. The first additional reflective layer AR1 may reflect light progressing toward the second-color color filter layer 420 inside the first-color quantum dot layer 415 in cooperation with the first reflective layer R1 to allow the reflected light to pass through the first-color color filter layer 410 and the top substrate 400 and to be emitted to the outside. For example, in an aspect of increasing light efficiency, the first additional reflective layer AR1 may be formed of the same material as the first pixel electrode 311, which is a reflective electrode.

The first additional reflective layer AR1 may include (e.g., be) the same material as the first reflective layer R1. In addition, the first additional reflective layer AR1 may be coupled (e.g., connected) to the first reflective layer R1.

Similar to the first additional reflective layer AR1, the third additional reflective layer AR3 is arranged at (e.g., on) a portion corresponding to the 3-$2^{nd}$ portion outside the 2-$3^{rd}$ opening 423 of the second-color color filter layer 420 in the third opening 503 of the bank 500 and on the bottom surface of the third-color quantum dot layer 435 in the direction (the −Z-axis direction) facing the bottom substrate 100. The third additional reflective layer AR3 may be coupled (e.g., connected, for example, physically or directly connected) to and/or may extend from the third reflective layer R3. The third additional reflective layer AR3 may reflect light progressing toward the second-color color filter layer 420 inside the third-color quantum dot layer 435 in cooperation with the third reflective layer R3 to allow the reflected light to pass through the third-color color filter layer 430 and the top substrate 400 and to be emitted to the outside. For example, in an aspect of increasing light efficiency, the third additional reflective layer AR3 may be formed of the same material as the third pixel electrode 331, which is a reflective electrode.

The third additional reflective layer AR3 may include (e.g., be) the same material as the third reflective layer R3. In addition, the third additional reflective layer AR3 may be coupled (e.g., connected) to the third reflective layer R3.

Figure 8:
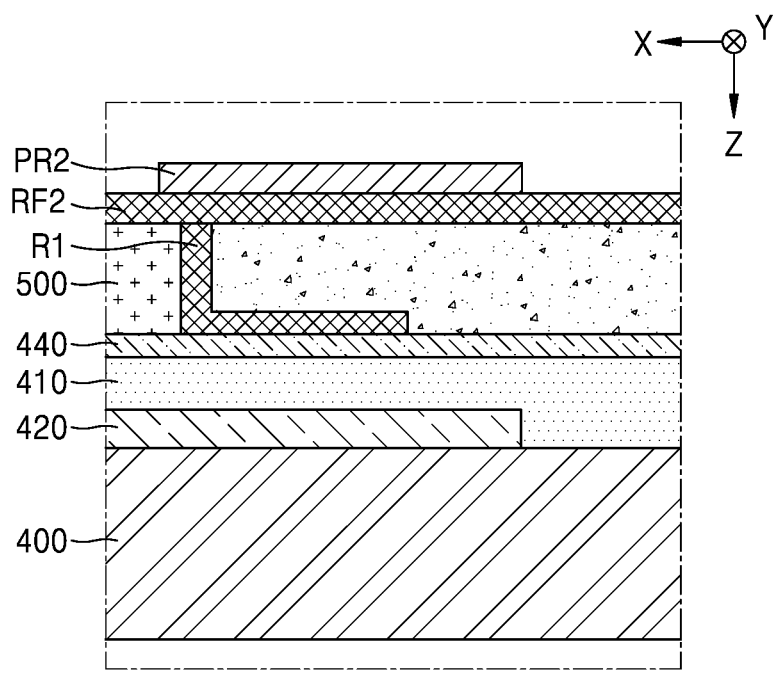
FIGS. 8 and 9 are each a cross-sectional view showing a process of manufacturing a portion of the display apparatus of FIG. 6.
Figure 9:
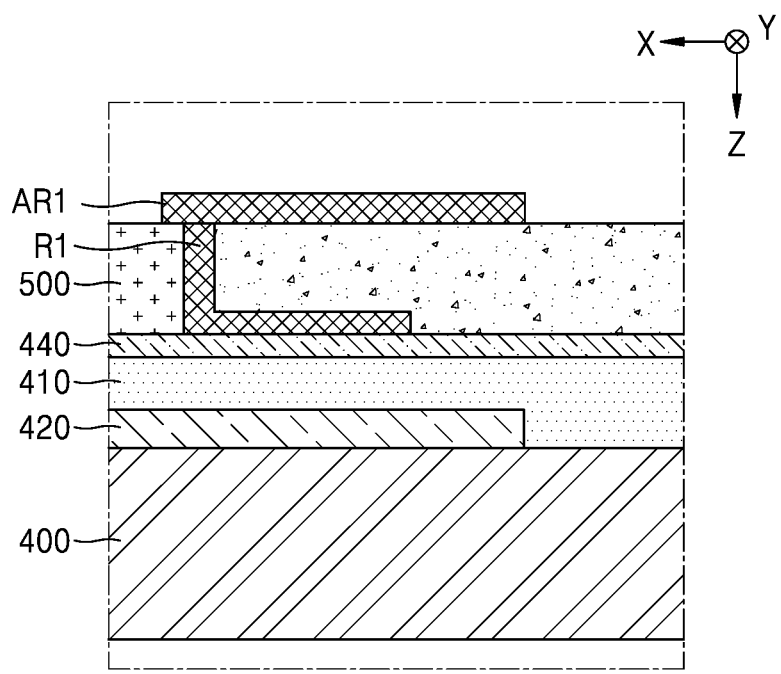

FIGS. 8 and 9 are each a cross-sectional view showing a process of manufacturing the first additional reflective layer AR1. First, after forming the structure described above with reference to FIG. 5, as shown in FIG. 8, a reflective layer RF2 is formed on the surface of the bank 500 in the direction facing the bottom substrate 100 and the surface of the first-color quantum dot layer 415 in the direction facing the bottom substrate 100 through sputtering by utilizing a material for forming the first additional reflective layer. Subsequently, the first additional reflective layer AR1 may be formed as shown in FIG. 9 by forming a photoresist layer PR2 on the reflective layer RF2 such that the photoresist layer PR2 is located at (e.g., on) where the first additional reflective layer is to be formed, removing portions of the reflective layer RF2 that are exposed to the outside of the photoresist layer PR2 (e.g., that are not covered by the photoresist layer PR2), and then removing the photoresist layer PR2. In this case, the first additional reflective layer AR1 may be coupled (e.g., connected) to the first reflective layer R1. The first additional reflective layer AR1 and the first reflective layer R1 may be formed as one body.

While the first additional reflective layer AR1 is formed, the third additional reflective layer AR3 may be simultaneously or concurrently formed by utilizing the same material as the first additional reflective layer AR1.

Figure 10:
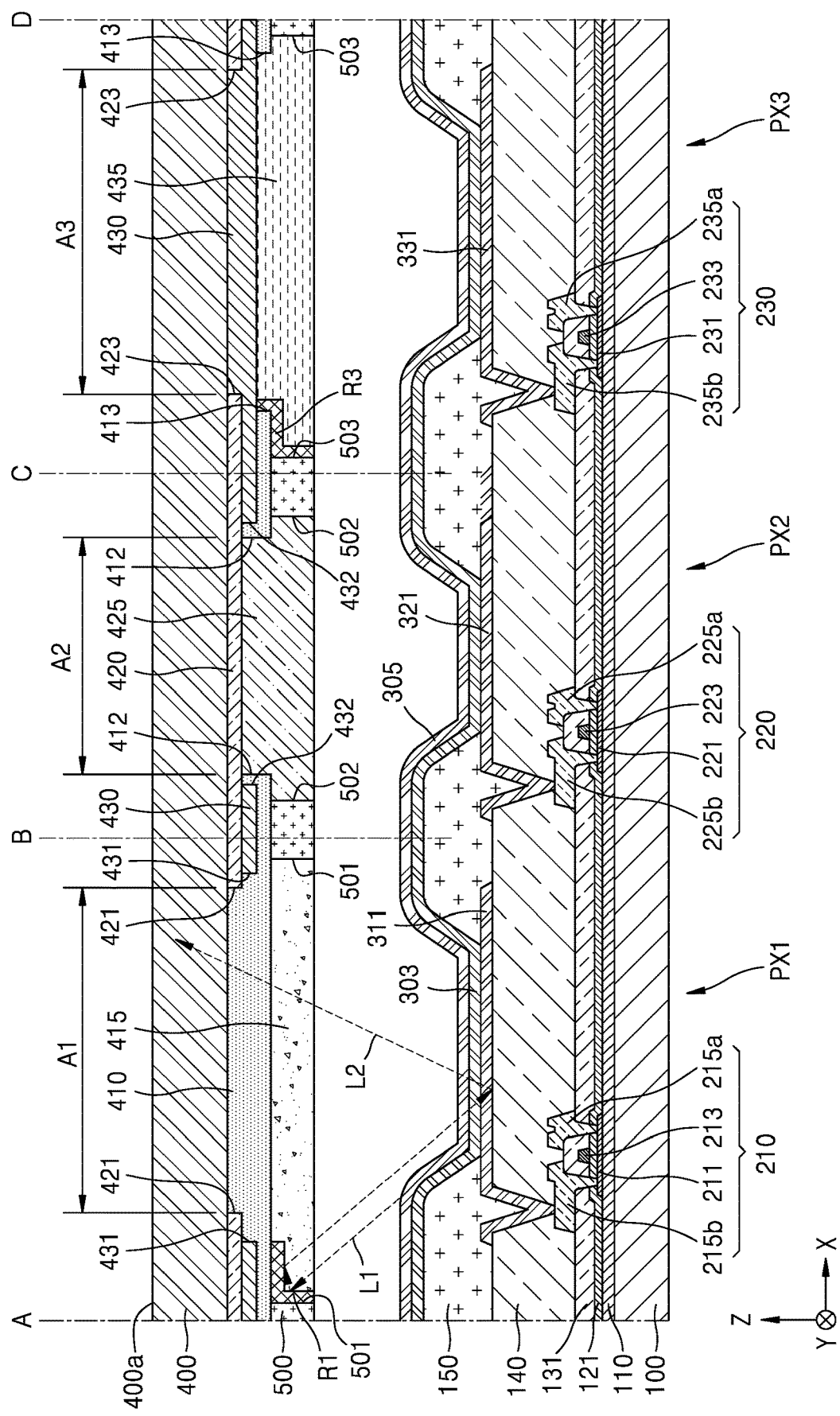
FIG. 10 is a cross-sectional view of a display apparatus according to another embodiment.

FIG. 10 is a cross-sectional view of a display apparatus according to another embodiment. The display apparatus according to the present embodiment is different from the display apparatus according to the previous embodiment described with reference to FIGS. 1 and 2 in that the third-color color filter layer 430 is arranged at (e.g., on) portions (e.g., portions of a bottom surface of the second-color color filter layer 420) between the first pixel PX1 and other pixels as well as a portion between the first pixel PX1 and the second pixel PX2. For example, similar to the first-color color filter layer 410 and the second-color color filter layer 420, the third-color color filter layer 430 may be formed on the entire surface of the top substrate 400 and may have a 3-$1^{st}$ opening 431 corresponding to the first region A1 and a 3-$2^{nd}$ opening 432 corresponding to the second region A2.

In this case, taking into account manufacturing tolerances, when viewed from the direction (the Z-axis direction) perpendicular to the bottom surface of the top substrate 400 (e.g., when viewed in the plan view from below the display apparatus), the breadth and/or area of the 3-$1^{st}$ opening 431 of the third-color color filter layer 430 may be equal to or greater than the breadth and/or area of the 2-$1^{st}$ opening 421 of the second-color color filter layer 420, and the breadth and/or area of the 3-$2^{nd}$ opening 432 of the third-color color filter layer 430 may be equal to or greater than the breadth and/or area of the 1-$2^{nd}$ opening 412 of the first-color color filter layer 410. Because the first pixel PX1 emits light having a wavelength of a first color to the outside through the top substrate 400 and the second pixel PX2 emits light having a wavelength of a second color to the outside through the top substrate 400, a region of a pixel having a first color may be defined through the 2-$1^{st}$ opening 421 of the second-color color filter layer 420, and a region of a pixel having a second color may be defined through the 1-$2^{nd}$ opening 412 of the first-color color filter layer 410. In this case, when viewed from the direction (the Z-axis direction) normal or perpendicular to the bottom surface of the top substrate 400 (e.g., when viewed in the plan view from below the display apparatus), edges of the 2-$1^{st}$ opening 421 are located inside the 3-$1^{st}$ opening 431, and edges of the 1-$2^{nd}$ opening 412 are located inside the 3-$2^{nd}$ opening 432.

In some embodiments, the edges of the 1-$2^{nd}$ opening 412 of the first-color color filter layer 410 may coincide with (e.g., may be aligned with) the edges of the 3-$2^{nd}$ opening 432 of the third-color color filter layer 430, and the edges of the 2-$1^{st}$ opening 421 of the second-color color filter layer 420 may coincide with (e.g., may be aligned with) the edges of the 3-$1^{st}$ opening 431 of the third-color color filter layer 430.

According to the embodiments of the present disclosure, a display apparatus in which light efficiency is improved while white balance of reflected light is maintained may be implemented. However, the disclosure is not limited by such an aspect.

It should be understood that embodiments described herein should be considered in a descriptive sense only and not for purposes of limitation. Descriptions of features and/or aspects within each embodiment should typically be considered as available for other similar features and/or aspects in other embodiments, respectively. While one or more embodiments have been described with reference to the drawings, it will be understood by those of ordinary skill in the art that various suitable changes in form and details may be made therein without departing from the spirit and scope as defined by the following claims and equivalents thereof.

What is claimed is:

1. A display apparatus comprising:
   a bottom substrate;
   a first light-emitting element over the bottom substrate and comprising a second-color emission layer;
   a top substrate over the bottom substrate with the first light-emitting element therebetween and comprising a first region corresponding to the first light-emitting element;
   a second-color color filter layer on a bottom surface of the top substrate facing the bottom substrate, the second-color color filter layer having a 2-$1^{st}$ opening that exposes the first region;
   a first-color color filter layer comprising a portion in the 2-$1^{st}$ opening and a portion on a bottom surface of the second-color color filter layer facing the bottom substrate;
   a bank between the first-color color filter layer and the bottom substrate and between the second-color color filter layer and the bottom substrate, the bank having a first opening that corresponds to the first region, the first opening comprising a 1-$1^{st}$ portion overlapping the 2-$1^{st}$ opening and a 1-$2^{nd}$ portion outside the 2-$1^{st}$ opening when viewed from a direction normal to the bottom surface of the top substrate;
   a first-color quantum dot layer in the first opening; and
   a first reflective layer on an inner surface of the first opening of the bank and on a portion of a top surface of the first-color quantum dot layer facing the top substrate, the portion of the top surface of the first-color quantum dot layer corresponding to the 1-$2^{nd}$ portion.

2. The display apparatus of claim 1, wherein the first reflective layer is on a portion of the inner surface of the first opening of the bank.

3. The display apparatus of claim 2, wherein, when viewed from a direction normal to the top substrate, the first opening comprises a portion protruding in a direction defined in a virtual plane parallel to the bottom surface of the top substrate, and
   the first reflective layer corresponds to the portion of the first opening that protrudes.

4. The display apparatus of claim 1, wherein the first light-emitting element comprises a reflective electrode.

5. The display apparatus of claim 1, further comprising a first additional reflective layer on a portion of a bottom surface of the first-color quantum dot layer facing the bottom substrate, the portion of the bottom surface of the first-color quantum dot layer corresponding to the 1-$2^{nd}$ portion.

6. The display apparatus of claim 5, wherein the first reflective layer is coupled to the first additional reflective layer.

7. The display apparatus of claim 1, further comprising a second light-emitting element over the bottom substrate and comprising the second-color emission layer,
   wherein the second-color color filter layer covers a second region of the top substrate that corresponds to the second light-emitting element,
   the first-color color filter layer has a 1-$2^{nd}$ opening that corresponds to the second region,
   the bank has a second opening corresponding to the second region, and
   when viewed from the direction normal to the bottom surface of the top substrate, the second opening comprises a 2-$1^{st}$ portion overlapping the 1-$2^{nd}$ opening and a 2-$2^{nd}$ portion outside the 1-$2^{nd}$ opening.

8. The display apparatus of claim 7, wherein the second light-emitting element comprises a reflective electrode.

9. The display apparatus of claim 7, further comprising a third light-emitting element over the bottom substrate and comprising the second-color emission layer,
   wherein the second-color color filter layer has a 2-$3^{rd}$ opening that exposes a third region of the top substrate that corresponds to the third light-emitting element,
   the first-color color filter layer has a 1-$3^{rd}$ opening that corresponds to the third region,
   the bank has a third opening that corresponds to the third region,
   when viewed from the direction normal to the bottom surface of the top substrate, the third opening comprises a 3-1$^{st}$ portion overlapping the 2-3$^{rd}$ opening and a 3-2$^{nd}$ portion outside the 2-3$^{rd}$ opening, and the display apparatus further comprises:
- a third-color color filter layer in the 2-3$^{rd}$ opening;
- a third-color quantum dot layer in the third opening; and
- a third reflective layer on an inner surface of the third opening of the bank and on a portion of a top surface of the third-color quantum dot layer facing the top substrate, the portion of the top surface of the third-color quantum dot layer corresponding to the 3-2$^{nd}$ portion.

10. The display apparatus of claim 9, wherein the third reflective layer is on a portion of the inner surface of the third opening of the bank.

11. The display apparatus of claim 10, wherein, when viewed from a direction normal to the top substrate, the third opening comprises a portion protruding in a first direction defined in a virtual plane parallel to the bottom surface of the top substrate facing the bottom substrate, and
the third reflective layer corresponds to the portion that protrudes.

12. The display apparatus of claim 11, wherein, when viewed from the direction normal to the top substrate, the first opening comprises a portion protruding in the first direction,
the first reflective layer is on a portion of the inner surface of the first opening of the bank, and
the portion of the top surface of the first-color quantum dot layer facing the top substrate that the first reflective layer is on corresponds to the portion of the first opening that protrudes.

13. The display apparatus of claim 9, wherein the third light-emitting element comprises a reflective electrode.

14. The display apparatus of claim 9, further comprising a third additional reflective layer on a portion of a bottom surface of the third-color quantum dot layer facing the bottom substrate, the portion of the bottom surface of the third-color quantum dot layer corresponding to the 3-2$^{nd}$ portion.

15. The display apparatus of claim 14, wherein the third reflective layer is coupled to the third additional reflective layer.

* * * * *